(12) United States Patent
Choi et al.

(10) Patent No.: US 8,004,347 B2
(45) Date of Patent: Aug. 23, 2011

(54) INTERNAL SUPPLY VOLTAGE GENERATOR CAPABLE OF REDUCING LATCH-UP AND SEMICONDUCTOR DEVICE HAVING THE SAME

(75) Inventors: Byung-ho Choi, Gyeonggi-do (KR); Jae-youn Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/488,117

(22) Filed: Jun. 19, 2009

(65) Prior Publication Data

US 2009/0315528 A1    Dec. 24, 2009

(30) Foreign Application Priority Data

Jun. 19, 2008    (KR) .................. 10-2008-0058020

(51) Int. Cl.
*G05F 3/08* (2006.01)
*H02M 3/00* (2006.01)

(52) U.S. Cl. .................. 327/535; 327/538; 363/59
(58) Field of Classification Search .................. None
See application file for complete search history.

(56) References Cited

U.S. PATENT DOCUMENTS

| 5,606,491 | A  | * | 2/1997  | Ellis .............................. 363/60 |
| 6,255,896 | B1 | * | 7/2001  | Li et al. ........................ 327/536 |
| 6,744,689 | B2 | * | 6/2004  | Itou ............................. 365/228 |
| 7,099,166 | B2 | * | 8/2006  | Kim ............................... 363/60 |
| 7,576,592 | B2 | * | 8/2009  | Kim et al. ..................... 327/536 |
| 7,633,331 | B2 | * | 12/2009 | Jurasek et al. ................ 327/536 |
| 7,742,346 | B2 | * | 6/2010  | Chen ....................... 365/189.09 |
| 2006/0268625 | A1 | * | 11/2006 | Imaizumi et al. ........ 365/189.01 |

FOREIGN PATENT DOCUMENTS

| JP | 09-331671      | 12/1997 |
| KR | 1020010081252 A | 8/2001 |
| KR | 1020020065346 A | 8/2002 |
| KR | 1020060002669 A | 1/2006 |

* cited by examiner

*Primary Examiner* — Lincoln Donovan
*Assistant Examiner* — Terry L Englund
(74) *Attorney, Agent, or Firm* — Myers Bigel Sibley & Sajovec, P.A.

(57) ABSTRACT

Provided are an internal supply voltage generator capable of reducing latch-up and a semiconductor device having the same. The internal supply voltage generator generates at least one internal supply voltage, and includes a first booster circuit that generates a first voltage from a first reference voltage and an input voltage and outputs the first voltage via a first output terminal, a second booster circuit that generates a third voltage from a second voltage and the first voltage and outputs the third voltage via a second output terminal, and at least one switch that is disposed to correspond to at least one of the first output terminal and the second output terminal and adjusts at least one of the first voltage and the third voltage.

19 Claims, 7 Drawing Sheets

INTERNAL SUPPLY VOLTAGE GENERATOR CAPABLE OF REDUCING LATCH-UP AND SEMICONDUCTOR DEVICE HAVING THE SAME

CROSS-REFERENCE TO RELATED APPLICATIONS

This application claims the benefit of Korean Patent Application No. 10-2008-0058020, filed on Jun. 19, 2008, in the Korean Intellectual Property Office, the disclosure of which is incorporated herein in its entirety by reference.

BACKGROUND

The inventive concept relates to an internal supply voltage generator and a semiconductor device having the same, and more particularly, to an internal supply voltage generator capable of reducing latch-up and a semiconductor device having the same.

In general, a semiconductor device includes an internal supply voltage generator that receives an external supply voltage and generates various internal supply voltages from the external supply voltage. For example, if the internal supply voltage generator is included in a driving circuit that drives a display device, e.g., a liquid crystal display (LCD), the internal supply voltage generator generates various internal supply voltages for driving the display device. Since the internal supply voltage generator independently generates voltages used in a semiconductor device, it is important to generate stable internal voltages regardless of a change in temperature, processes, or pressure.

If a semiconductor device operates in response to an internal supply voltage from the internal supply voltage generator, latch-up occurs according to the operating characteristics of the semiconductor device. Here, latch-up is a phenomenon that a current path is formed between a supply voltage source and a ground voltage source due to a parasitic bipolar transistor component generated in a device, thereby causing over-current to flow. Latch-up causes the device to be damaged or to malfunction.

FIG. 1 is a cross-sectional view of a general semiconductor circuit. In more detail, FIG. 1 illustrates an NMOS transistor and a PMOS transistor of a complementary metal-oxide semiconductor (CMOS) inverter 10, as an example of the general semiconductor circuit As illustrated in FIG. 1, the CMOS inverter 10 is fabricated by forming a P-well 12 and an N-well 13 in a P-type substrate 11. In the P-well 12, N-type impurities are formed to obtain the NMOS transistor. An electrode is disposed between the N-type impurities to receive an input signal IN. A ground voltage VSS is applied to one of the N-type impurities, and the other N-type impurity is connected to an output terminal for delivering an output signal OUT. In the P-well 12, a P-type impurity is further formed to apply thereto a predetermined low voltage, for example, a low voltage VL that is less than the ground voltage VSS.

In the N-well 13, P-type impurities are formed to obtain the PMOS transistor. An electrode is disposed between the P-type impurities to receive the input signal IN. A supply voltage VDD is applied to one of the P-type impurities, and the other P-type impurity is connected to an output terminal for delivering the output signal OUT. In the N-well 13, an N-type impurity is further formed to apply thereto a predetermined high voltage, for example, a high voltage VH that is greater than the supply voltage VDD.

In the CMOS inverter 10, parasitic transistor components that correspond to a PNP-type bipolar transistor and an NPN-type bipolar transistor are generated as will be described in detail with reference to FIG. 2.

FIG. 2 is a circuit diagram of parasitic transistors formed in the CMOS inverter 10 of FIG. 1. As illustrated in FIG. 2, the parasitic transistors include a PNP-type bipolar transistor T1 that is connected between a supply voltage source VDD and a low voltage source VL, and an NPN-type bipolar transistor T2 connected between a high voltage source VH and a ground voltage source VSS. Also, a collector of the PNP-type bipolar transistor T1 is connected to a base of the NPN-type bipolar transistor T2, and a base of the PNP-type bipolar transistor T1 is connected to a collector of the NPN-type bipolar transistor T2.

The PNP-type and NPN-type parasitic transistors T1 and T2 illustrated in FIG. 2 may be forward biased or reverse biased according to voltages applied to electrodes of the PNP-type and NPN-type parasitic transistors T1 and T2. When the PNP-type and NPN-type parasitic transistors T1 and T2 are turned on by applying a voltage thereto in a forward direction, over-current flows through them due to latch-up.

An internal supply voltage generating circuit that includes a multi-stage booster circuit, and thus, is capable of sequentially generating internal voltages, has been widely used as an example of an internal supply voltage generating circuit generating a plurality of internal voltages. If the internal supply voltage generating circuit that employs a multi-stage booster circuit applies internal voltages to the CMOS inverter 10 of FIG. 1, a high internal voltage VH and a low internal voltage VL are sequentially generated and provided at predetermined intervals of time. Thus, a probability that the PNP-type and NPN-type parasitic transistors T1 and T2 will be turned on is increased more than when the multi-stage booster circuit is not employed.

Thus, when an internal supply voltage generating circuit that employs a multi-stage booster circuit is used in a semiconductor device, latch-up is more likely to occur in a semiconductor device than when the multi-stage booster circuit is not employed.

SUMMARY

According to an aspect of the inventive concept, there is provided an internal supply voltage generator for generating at least one internal supply voltage, the internal supply voltage generator including a first booster circuit generating a first voltage from a first reference voltage and an input voltage, and outputting the first voltage via a first output terminal; a second booster circuit generating a third voltage from a second voltage and the first voltage, and outputting the third voltage via a second output terminal; and at least one switch being disposed to correspond to at least one of the first output terminal and the second output terminal, and adjusting at least one of the first voltage and the third voltage.

The at least one switch may include a first switch electrically connected between the first output terminal and the first reference voltage, and controlled in response to a first control signal; and a second switch electrically connected between the second output terminal and the second voltage, and controlled in response to a second control signal.

Switching of the first and second switches may be controlled when the first and second booster circuits are activated.

The first and second booster circuits may be sequentially activated. When the first booster circuit is activated, the first switch may be turned off and the second switch is turned on. When the second booster circuit is activated, the first and second switches may be turned off.

The internal supply voltage generator may further include a third voltage booster circuit receiving an external voltage, and generating the input voltage and the second voltage from the external voltage.

The first booster circuit may boost the input voltage by using the first reference voltage, and the second booster circuit may boost the first voltage by using the second voltage.

Both the first and second switches may be turned on in a first period in which the third voltage booster circuit is activated. The first switch may be turned off and the second switch may be turned on in a second period in which the first booster circuit is activated. Both the first and second switches may be turned off in a third period in which the second booster circuit is activated.

The first period may include a period between when the third voltage booster circuit is activated and when the input voltage and the second voltage are stabilized. The second period may include a period between when the first booster circuit is activated and when the first voltage is stabilized. The third period may include a period between when the second booster circuit is activated and when the third voltage is stabilized.

The first voltage may be a relatively low internal voltage generated in the internal supply voltage generator. The second voltage may be an intermediate internal voltage generated in the internal supply voltage generator. The third voltage may be a relatively high internal voltage generated in the internal supply voltage generator.

The first reference voltage may be equal to a ground voltage.

According to another aspect of the inventive concept, there is provided a semiconductor device including an internal supply voltage generator, a circuit block, and at least one switch. The internal supply voltage generator includes a first booster circuit generating a first voltage from a first reference voltage and an input voltage, and outputting the first voltage via a first output terminal; and a second booster circuit generating a third voltage from a second voltage and the first voltage, and outputting the third voltage via a second output terminal. The circuit block operates in response to at least one of the first to third voltages applied from the internal supply voltage generator. The at least one switch is disposed to correspond to at least one of the first output terminal and the second output terminal, and adjusts at least one of the first voltage and the third voltage According to another aspect of the inventive concept, there is provided a method of driving an internal supply voltage generator generating at least one of first to third voltages, wherein the first voltage is a relatively low voltage, the second voltage is an intermediate voltage, and the third voltage is a relatively high voltage, and a first switch is connected to a first output terminal via which the first voltage is output and a second switch is connected to a second output terminal via which the third voltage is output. The method includes generating at least one input voltage that is used to generate the first and third voltages while the first and second switches are turned on; turning off the first switch, and activating the first voltage by using the at least one input voltage; and turning off the second switch, and activating the third voltage by using the at least one input voltage.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
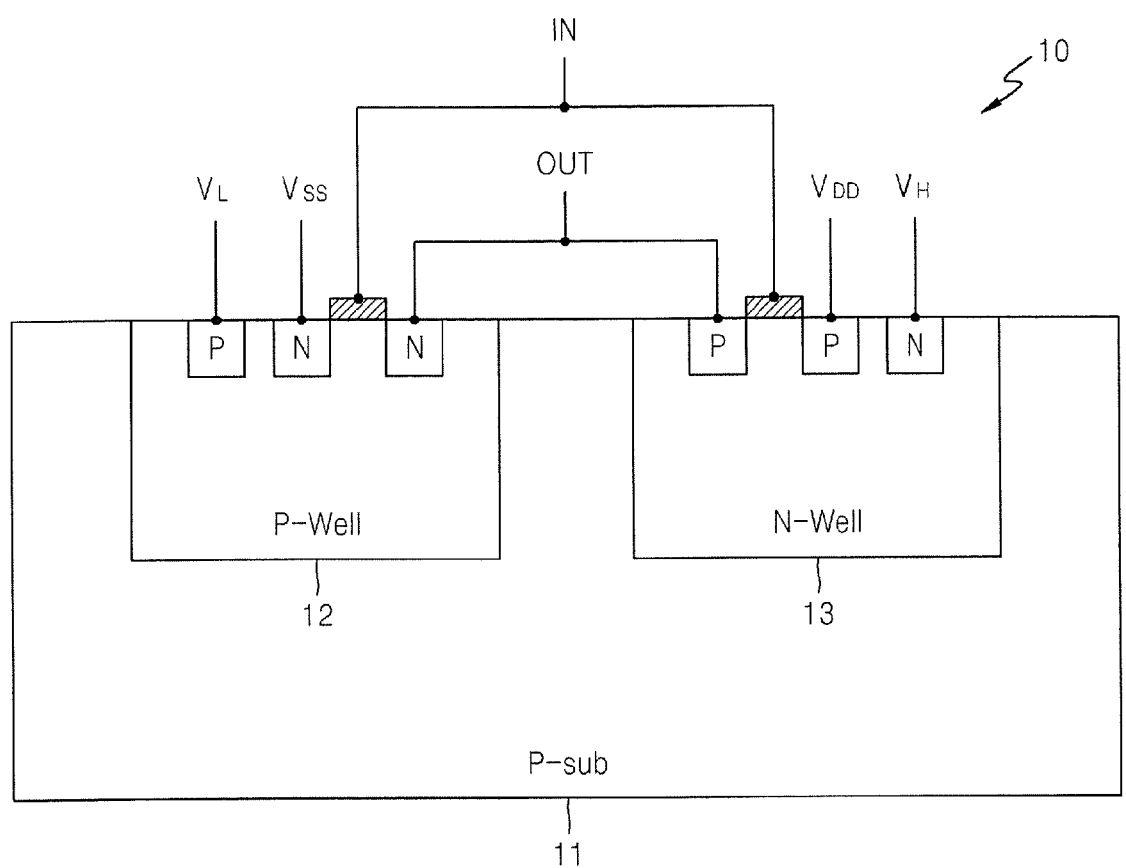
FIG. 1 is a cross-sectional view of a general semiconductor circuit.
Figure 2:
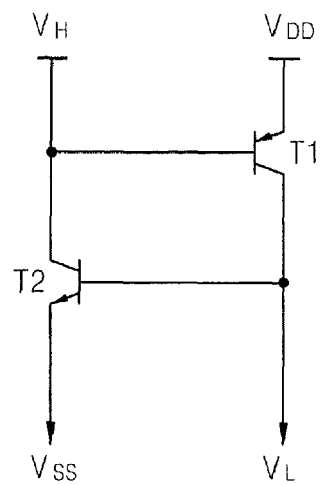
FIG. 2 is a circuit diagram of parasitic transistors formed in a complementary metal-oxide semiconductor (CMOS) inverter of FIG. 1.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises," "comprising," "having," "having," "includes," and/or "including" when used in this specification, specify the presence of stated features, regions, steps, operations, elements, and/or components, but do not preclude the presence or addition of one or more other features, regions, steps, operations, elements, components, and/or groups thereof.

It will be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 3:
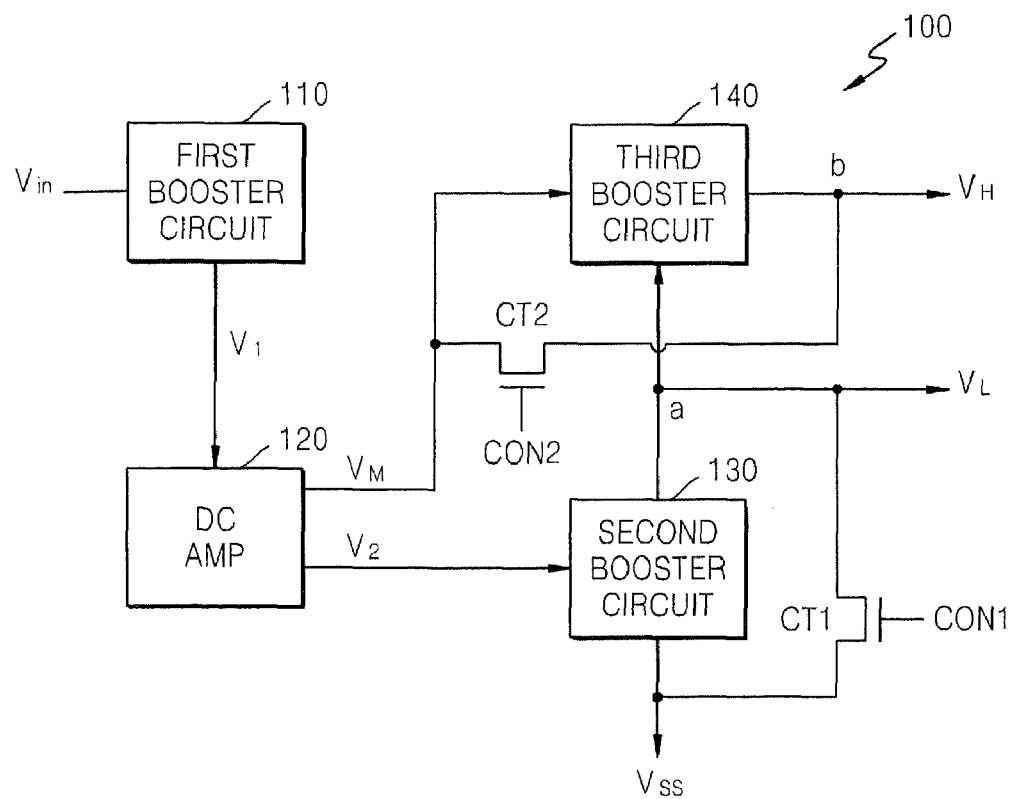
FIG. 3 is a block diagram of an internal supply voltage generator according to an embodiment of the inventive concept.

FIG. 3 is a block diagram of an internal supply voltage generator 100 according to an embodiment of the inventive concept. Referring to FIG. 3, the internal supply voltage generator 100 generates at least one internal voltage, which will be used in a semiconductor device (not shown), from a voltage Vin applied from the outside. For example, if the semiconductor device is a driving integrated circuit (IC) for driving a liquid crystal display (LCD), a high internal voltage, e.g., about 20 to 30 V, is needed to drive the liquid crystal in the LCD.

The internal supply voltage generator 100 may include a multi-stage booster circuit in order to sequentially generate the at least one internal voltage. As appreciated by the present inventors, sequential booster circuits are less sensitive to process-voltage-temperature (PVT) variations and boost with less capacitance than booster circuits that are arranged in parallel. Thus, the sequential booster circuits may be applied to a liquid crystal driving IC and so on in some embodiments.

The internal supply voltage generator 100 may include one or more booster circuits and generate the at least one internal voltage. As illustrated in FIG. 3, the internal supply voltage generator 100 may include booster circuits that respectively generate a low internal voltage VL (hereinafter referred to as 'first voltage') and a high internal voltage VH (hereinafter referred to as 'third voltage'). The internal supply voltage generator 100 may further include another booster circuit that generates an internal voltage VM (hereinafter referred to as 'second voltage) that is greater than the first voltage VL and is less than the third voltage VH. The internal supply voltage generator 100 may be embodied in various ways according to the total number of internal voltages to be generated and operating characteristics thereof. Although FIG. 3 illustrates that internal supply voltage generator 100 includes three booster circuits, the inventive concept is not limited thereto.

First, when a first booster circuit 110 is activated, the first booster circuit 110 generates a voltage V1 having a predetermined level by boosting a predetermined voltage, e.g., the external voltage Vin. Next, when a direct current (DC) amplifier 120 is activated, the DC amplifier 120 generates a voltage V2, which is to be applied to a second booster circuit 130, and generates the second voltage VM, which is to be applied to a third booster circuit 140, by using the voltage V1 from the first booster circuit 110. The second voltage VM may be an internal voltage generated in the internal supply voltage generator 100, and be applied to a circuit block (not shown) that operates in response to the second voltage VM generated in the internal supply voltage generator 100.

Then, the second booster circuit 130 generates the first voltage VL, which is a low internal voltage, from the voltage V2 received from the DC amplifier 120 and a predetermined reference voltage VSS, for example, a ground voltage VSS. The first voltage VL generated by the second booster circuit 130 is applied to the third booster circuit 140. Next, when the third booster circuit 140 is activated, the third booster circuit 140 generates the third voltage VH, which is a high internal voltage, from the first and second voltages VL and VM. The third booster circuit 140 may generate the third voltage VH by boosting the first voltage VL and using the second voltage VM as a reference voltage.

The at least one internal voltage, for example, the first to third voltages VL, VM and VH, which are generated as described above, is applied to the circuit block included in the semiconductor device. The circuit block performs functions assigned thereto by using the at least one internal voltage.

In semiconductor devices generally employing CMOS circuit technology, a parasitic bipolar transistor component is generated between an N-channel transistor and a P-channel transistor, thus causing latch-up to occur. The parasitic bipolar transistor component has a structure in which a base and collector of a PNP-type bipolar transistor are respectively connected to a collector and a base of an NPN-type bipolar transistor. In particular, when a predetermined circuit block operates in response to internal voltages being sequentially received from the internal supply voltage generator 100, latch-up is highly likely to occur due to the parasitic bipolar transistor component.

In order to reduce latch-up, at least one switch may further be included in the internal supply voltage generator 100 as illustrated in FIG. 3. The at least one switch may be disposed to correspond to at least one of a first output terminal a of the second booster circuit 130 and a second output terminal b of the third booster circuit 140 in order to adjust the first voltage VL or the third voltage VH.

The at least one switch may include a first switch CT1 connected to the first output terminal a, and a second switch CT2 connected to the second output terminal b. The first switch CT1 may operate in response to a first control signal CON1, and may be electrically connected between the first output terminal a and a reference voltage (ground voltage VSS) applied to the second booster circuit 130. The second switch CT2 may operate in response to a second control signal CON2 and may be connected between the second output terminal b and a reference voltage (the second voltage VM) applied to the third booster circuit 140. Switching of the first switch CT1 and the second switch CT2 is controlled when the first booster circuit 110, the DC amplifier 120, the second booster circuit 130, and the third booster circuit 140 are activated, as will later be described in detail.

Figure 8:
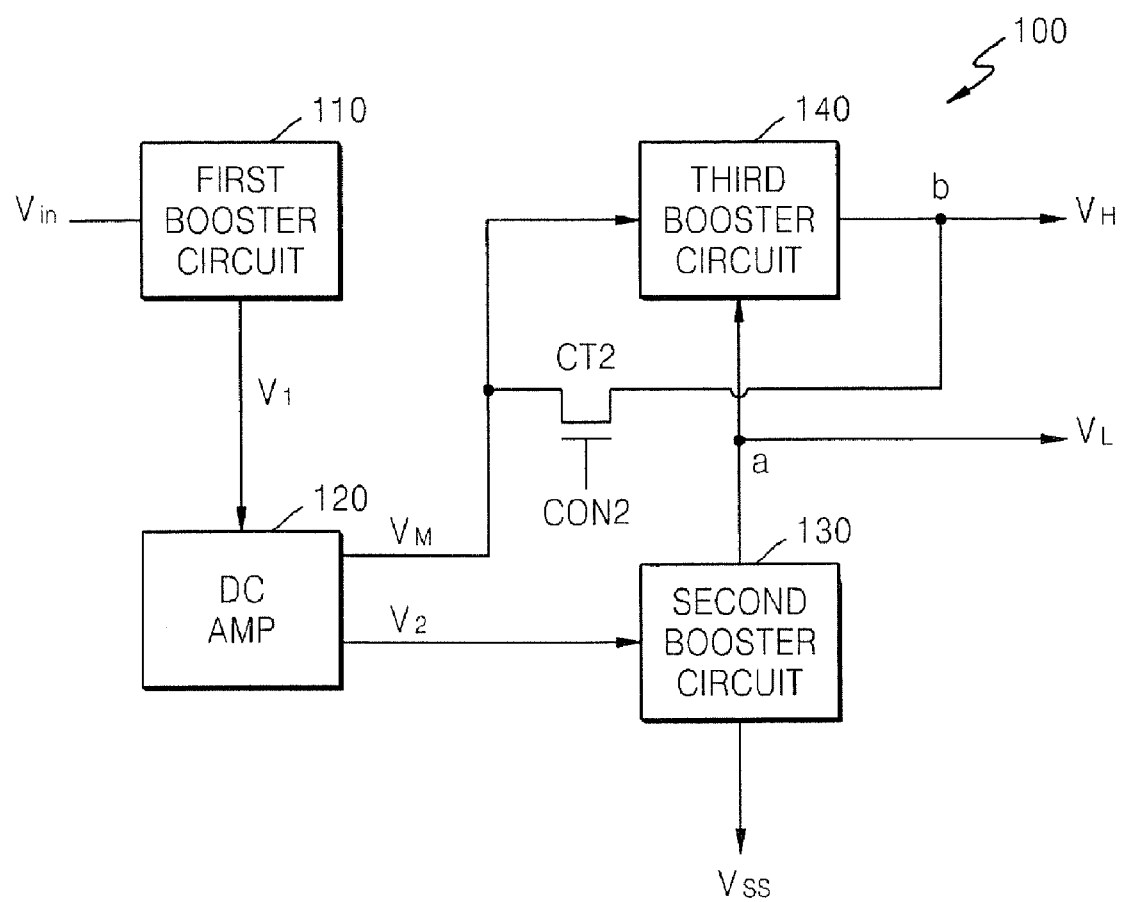
FIG. 8 is a block diagram of an internal supply voltage generator according to an embodiment of the inventive concept utilizing a single switch.

FIG. 8 illustrates a block diagram of an internal supply voltage generator 100 according to an embodiment of the inventive concept utilizing a single switch rather than a pair as shown in FIG. 3.

Figure 4:
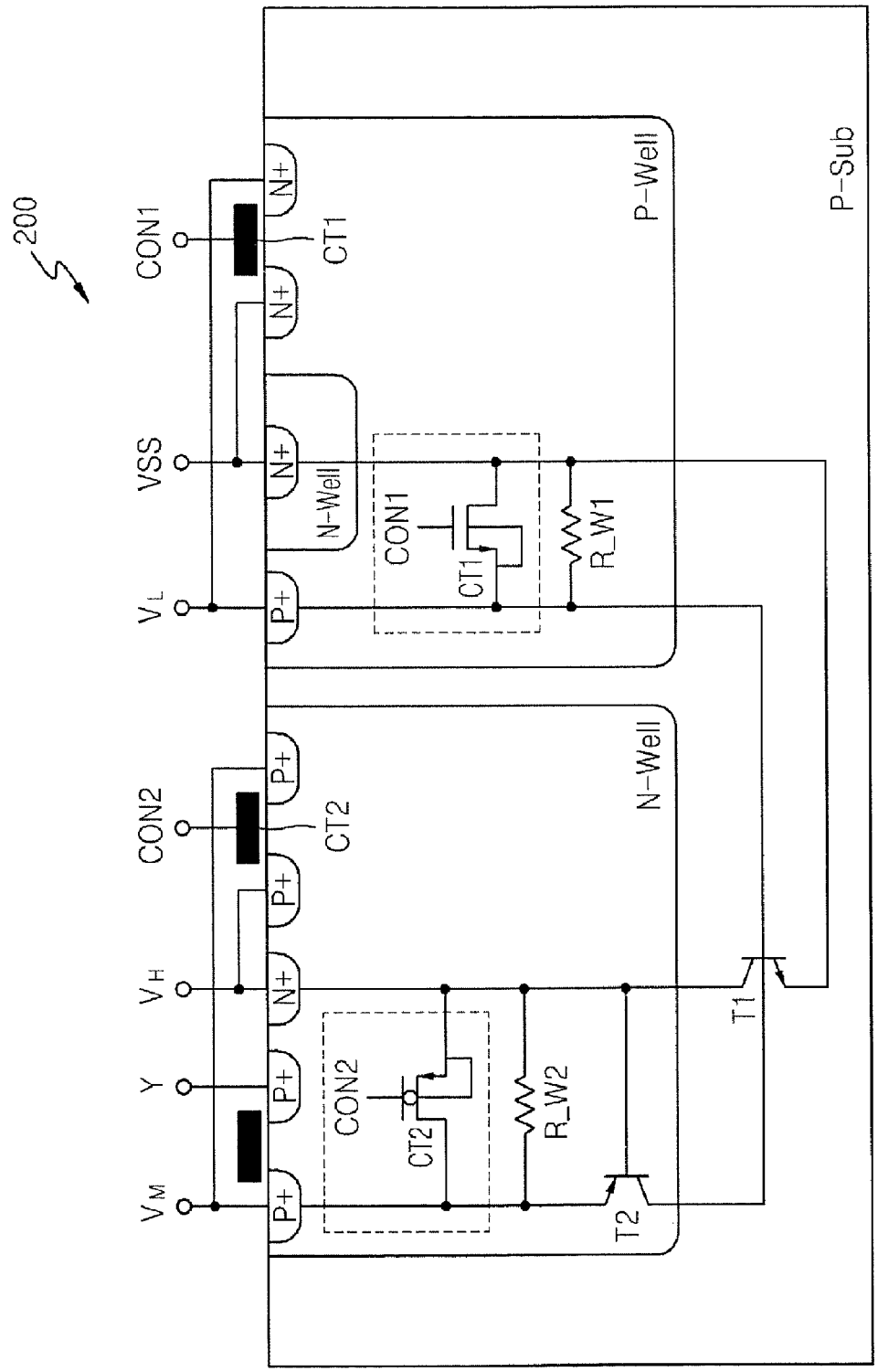
FIG. 4 is a cross-sectional view of a semiconductor device according to an embodiment of the inventive concept.

FIG. 4 is a cross-sectional view of a semiconductor device, e.g., an output driver 200 included in a liquid crystal driving IC, according to an embodiment of the inventive concept. In detail, FIG. 4 is a cross-sectional view of a circuit block that operates in response to the first voltage VL, the second voltage VM, and the third voltage VH generated in the internal supply voltage generator 100 of FIG. 3. For convenience of explanation, NPN-type and PNP-type parasitic bipolar transistor T1 and T2 and well resistance components R_W1 and R_W2 which are generated in the circuit block and the first switch CT1 and the second switch CT2 of FIG. 3 are illustrated in FIG. 4.

The output driver 200 operates in response to the first voltage VL, the second voltage VM, and the third voltage VH. A node Y denotes an output terminal of the output driver 200. Although FIG. 3 illustrates that the first switch CT1 and the second switch CT2 are included in the internal supply voltage generator 100, the inventive concept is not limited thereto. For example, the first switch CT1 and the second switch CT2 may be illustrated to be respectively connected to input terminals of the output driver 200. The first switch CT1 and the second switch CT2 may be illustrated to be disposed between the internal supply voltage generator 100 and the output driver 200. For convenience of explanation, FIG. 4 illustrates the output driver 200 that operates in response to the first voltage VL, the second voltage VM, and the third voltage VH, together with the first switch CT1 and the second switch CT2 illustrated in FIG. 3.

As illustrated in FIG. 4, the output driver 200 has a parasitic p-n-p-n structure in which latch-up is likely to occur. Also, a collector and a base of the NPN-type parasitic bipolar transistor T1 are respectively connected to a base and collector of the PNP-type parasitic bipolar transistor T2. In order to reduce latch-up in this case, the first switch CT1 is connected between the first voltage source VL and the reference voltage VSS, and the second switch CT2 is connected between the second voltage VM and the third voltage VH. Thus, the base and emitter of the NPN-type parasitic bipolar transistor T1 are connected via the first switch CT1, and the base and emitter of the PNP-type parasitic bipolar transistor T2 are connected via the second switch CT2.

A method of reducing latch-up by using the internal supply voltage generator 100 and the output driver 200 illustrated in FIGS. 3 and 4, according to an embodiment of the inventive concept, will now be described with reference to FIGS. 5 and 6.

Figure 5:
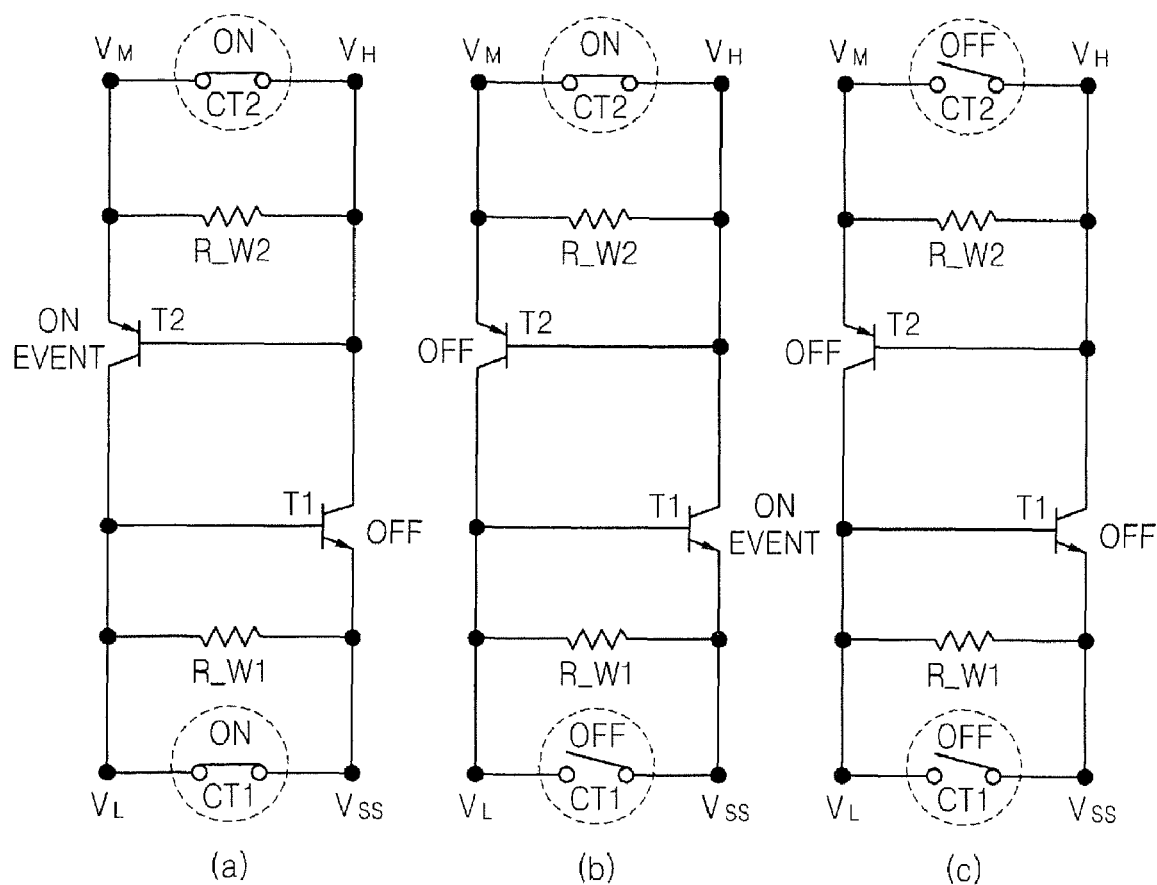
FIG. 5 is a circuit diagram illustrating operating characteristics of a first switch and a second switch of FIG. 3, according to an embodiment of the inventive concept.

FIG. 5 is a circuit diagram illustrating operating characteristics of the first switch CT1 and the second switch CT2 of FIG. 3, according to an embodiment of the inventive concept. First, referring to FIG. 5(a), both the first switch CT1 and the second switch CT2 are turned on during an initial operating stage of the internal supply voltage generator 100 of FIG. 3. The first switch CT1 and the second switch CT2 may be turned on until the first booster circuit 110 and the DC amplifier 120 generate a stable voltage V2 and a stable second voltage VM, starting from the initial operating stage of the internal supply voltage generator 100.

The first switch CT1 may be fabricated to be large in size so that a turn-on resistance of the first switch CT1 is less than a well resistance R_W1 between the first voltage VL and the reference voltage VSS. Likewise, the second switch CT2 may be fabricated to be large in size so that a turn-on resistance of the second switch CT2 is less than a well resistance component R_W2 between the second voltage VM and the third voltage VH. In this case, the equivalent resistance value of the turn-on resistance of the first switch CT1 and the well resistance R_W1 which are connected in parallel, corresponds to the turn-on resistance of the first switch CT1. Also, the equivalent resistance value of the turn-on resistance of the second switch CT2 and the well resistance R_W2, corresponds to the turn-on resistance of the second switch CT2. If the first switch CT1 or the second switch CT2 has a width of about 3000 um, the turn-on resistances of the first and second switches CT1 and CT2 are lowered to several ohms.

When the first switch CT1 and the second switch CT2 are turned on, the base and emitter of the NPN-type parasitic bipolar transistor T1 are connected via the first switch CT1, and the base and emitter of the PNP-type parasitic bipolar transistor T2 are connected via the second switch CT2. Thus, even if the DC amplifier 120 is activated to amplify the second voltage VM, the base and emitter of the PNP-type parasitic bipolar transistor T2 are at the same potential since the second switch CT2 is turned on, thereby preventing the PNP-type parasitic bipolar transistor T2 from being turned on.

However, the PNP-type parasitic bipolar transistor T2 may be unexpectedly turned on during a delay time for the third voltage VH to be equal to the second voltage VM, thereby increasing a probability that latch-up will occur. To solve such problems, the first switch CT1 is turned on to not turn on the NPN-type parasitic bipolar transistor T1, thereby preventing latch-up from occurring.

Then, as illustrated in FIG. 5(b), the first switch CT1 is turned off in a period in which the second booster circuit 130 is activated. That is, the first switch CT1 is turned off to generate the first voltage VL but the second switch CT2 is kept turned on. The period illustrated in FIG. 5(b) may include a period between when the second booster circuit 130 is activated and when the first voltage VL is stabilized.

The NPN-type parasitic bipolar transistor T1 may be turned on when the first voltage VL is increased to a positive level due to boosting current of several micro amperes, e.g., about 0.5 to 1.0 mA, which is generated during the operation of the second booster circuit 130. However, as illustrated in FIG. 5(b), since the second switch CT2 is kept turned on, the PNP-type parasitic bipolar transistor T2 is kept turned off. Accordingly, it is possible to prevent latch-up from occurring.

Next, as illustrated in FIG. 5(c), both the first switch CT1 and the second switch CT2 are turned off in a period in which the third booster circuit 140 is activated. That is, in the period illustrated in FIG. 5(b), the first switch CT1 is turned off to generate the first voltage VL, and in the period illustrated in FIG. 5(c), the second switch CT2 is also turned off to generate the third voltage VH. The period illustrated in FIG. 5(c) may include a period between when the third booster circuit 140 is activated and when the third voltage VH is stabilized. Also, the second switch CT2 may be kept turned off when or before the third booster circuit 140 is activated.

The PNP-type parasitic bipolar transistor T2 may be turned on before the third voltage VH is stabilized right after the second switch CT2 is turned off. However, in the period illustrated in FIG. 5(b), the first voltage VL has already been stabilized to a low voltage, for example, a negative voltage, and thus the NPN-type parasitic bipolar transistor T1 is kept turned off. Thus, positive feedback does not occur, latch-up is prevented from occurring.

As described above, the internal supply voltage generator 100 or the output driver 200, according to an embodiment of the inventive concept, includes one or more switches, and the switches are appropriately turned on or off according to the boosting order performed by the internal supply voltage generator 100 that sequentially generates internal voltages. Also, a base and emitter of a parasitic transistor component in a circuit block that performs predetermined operations using the internal voltages are connected by turning on a switch, thereby preventing latch-up from occurring even when the parasitic transistor component is turned on. Also, the switches are appropriately turned off when a booster circuit is activated, thereby preventing latch-up from occurring and generating stable internal voltages.

Figure 6:
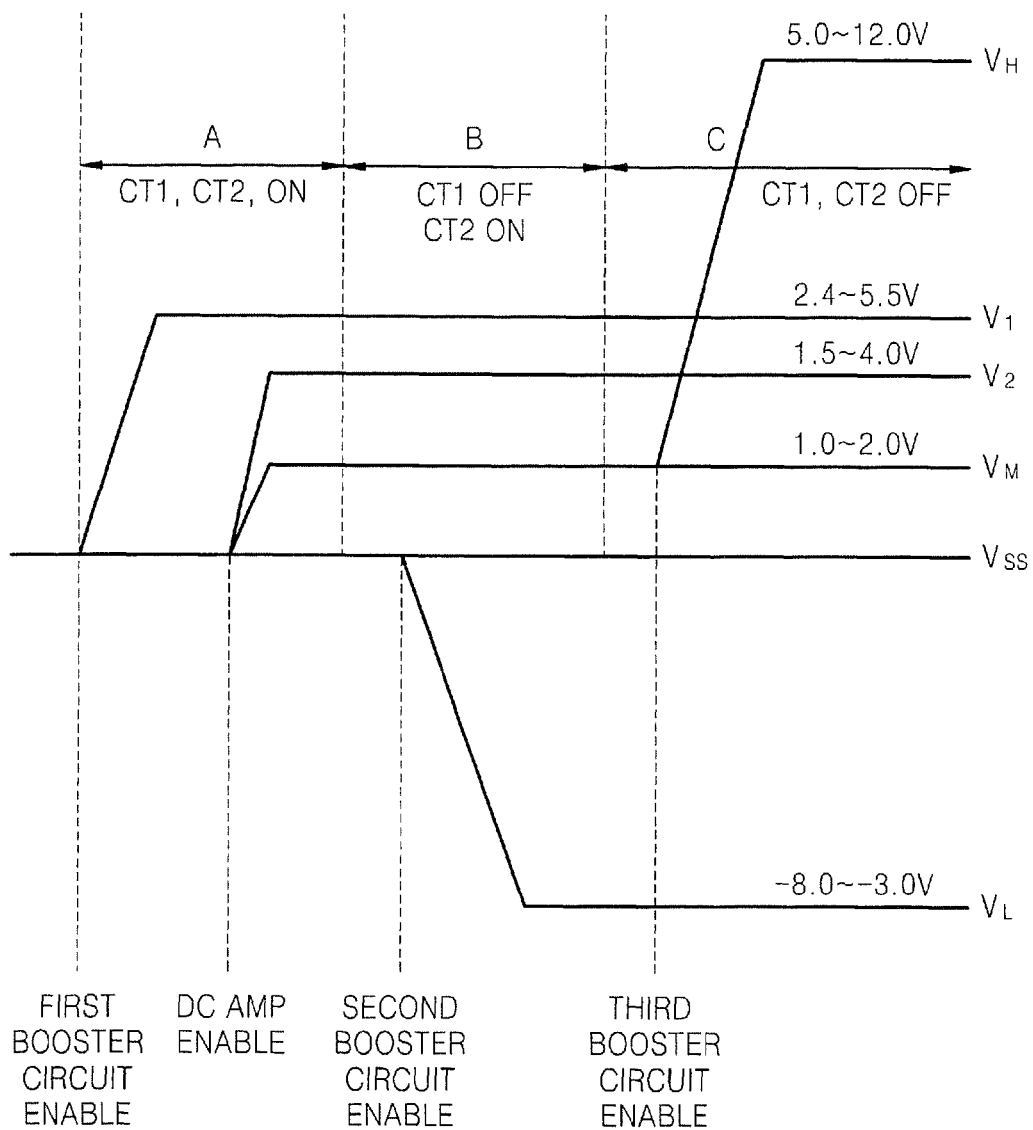
FIG. 6 is a waveform diagram of voltages generated in the internal supply voltage generator of FIG. 3.

FIG. 6 is a waveform diagram of voltages generated in the internal supply voltage generator 100 of FIG. 3. The voltages illustrated in FIG. 6 are just illustrative and the inventive concept is not limited thereto.

Referring to FIGS. 3 and 6, in a period A, both the first booster circuit 110 and the DC amplifier 120 are activated and both the first switch CT1 and the second switch CT2 are turned on. The DC amplifier 120 generates a voltage V2 and a second voltage VM, which are to be respectively applied to the second booster circuit 130 and the third booster circuit 140, from a voltage V1 received from the first booster circuit 110. In the period A, since the second switch CT2 is turned on, a third voltage VH output from the third booster circuit 140 is equal to the second voltage VM.

Then, in a period B, the second booster circuit 130 is activated, the first switch CT1 is turned off, and the second switch CT2 is kept turned on. The second booster circuit 130 generates a first voltage VL by boosting the voltage V2 by using a ground voltage VSS as a reference voltage. For example, the second booster circuit 130 generates the first voltage VL of −8.0 to −3.0 V by boosting the voltage V2 of 1.5 to 4.0 V twice with respect to the ground voltage VSS as a reference voltage in a manner of negative boosting. Even if the first voltage VL temporarily increases to a positive level, the PNP-type parasitic bipolar transistor T2 is turned off since the second switch CT2 is turned on, thereby preventing latch-up from occurring.

Next, in a period C, the third booster circuit 140 is activated and both the first switch CT1 and the second switch CT2 are turned off. The third booster circuit 140 generates a third voltage VH by boosting the first voltage VL and using the second voltage VM as a reference voltage. For example, the third booster circuit 140 generates the third voltage VH of 5.0 to 12.0 V by boosting the first voltage VL of −8.0 to −3.0 V one time with respect to the second voltage VM of 1.0 to 2.0 V as a reference voltage in a manner of negative boosting. The third voltage VH starts to increase from a point of time that the second switch CT2 is turned off. The PNP-type parasitic bipolar transistor T2 may be turned on before the third voltage VH is stabilized but the NPN-type parasitic bipolar transistor T1 is turned off because of the stabilized first voltage VL, thereby preventing latch-up from occurring.

Figure 7:
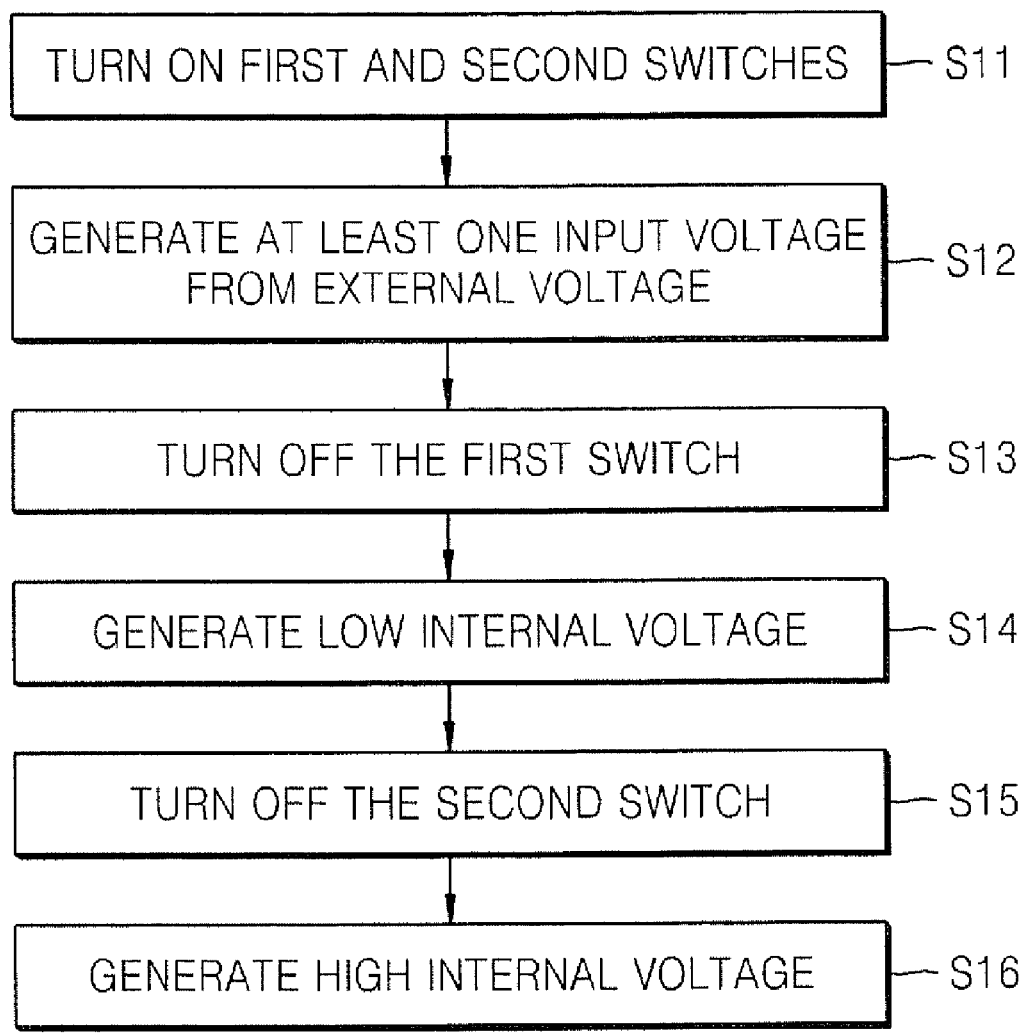
FIG. 7 is a flowchart illustrating a method of driving an internal supply voltage generator according to an embodiment of the inventive concept.

FIG. 7 is a flowchart illustrating a method of driving an internal supply voltage generator according to an embodiment of the inventive concept. As described above, the internal supply voltage generator includes at least one booster circuit in order to sequentially generate at least one internal voltage. For example, the internal supply voltage generator may include a booster circuit that generates a first voltage (low voltage), a booster circuit that generates a second voltage (intermediate voltage), and a booster circuit that generates a third voltage (high voltage). In order to sequentially generate the internal voltages, the booster circuit that generates the second voltage may be first activated, the booster circuit that generates the first voltage may be activated next, and finally, the booster circuit that generates the third voltage may be activated.

As described above, according to an embodiment of the inventive concept, internal voltages generated by the internal supply voltage generator are controlled by at least one switch. For example, a first output terminal of the booster circuit that generates the first voltage may be connected to a first switch. The first switch may be electrically connected between the first output terminal of the booster circuit and a reference voltage, i.e., ground voltage VSS. A second output terminal of the booster circuit that generates the third voltage may be connected to a second switch. The second switch may be electrically connected between the second output terminal of the booster circuit and the second voltage, i.e., the intermediate voltage.

A method of driving the above internal supply voltage generator will now be described.

First, the first and second switches are turned on (operation S11). Next, at least one input voltage is generated from an external voltage (operation S12). In detail, while the first and second switches are turned on, the at least one input voltage may be generated from an output terminal of a DC amplifier by boosting the external voltage and applying the boosted voltage to the DC amplifier. The at least one input voltage is applied to the booster circuit that generates a first voltage and the booster circuit that generates a third voltage. The at least one input voltage may include a second voltage. Thus, the second voltage generated by the DC amplifier may be output from the internal supply voltage generator and may be used as an internal voltage in a semiconductor device.

The third voltage that may also be generated by the internal supply voltage generator in operation S12 is equal to the second voltage, and the first voltage is equal to a ground voltage, which is an example of a reference voltage. Accordingly, even if parasitic transistor components are generated in a circuit block that operates in response to the at least one internal voltage generated by the internal supply voltage generator, a base and emitter of each of the parasitic transistors are at the same potential so that the parasitic transistors may be turned off, and thus reducing latch-up. For example, both a first parasitic transistor to which the first voltage and the ground voltage are respectively applied to the base and emitter thereof, and a second parasitic transistor to which the second voltage and the third voltage are respectively applied to the base and emitter thereof are turned off.

When the at least one input voltage is stabilized, the first switch is turned off in order to generate the first voltage (operation S13). In this case, the second switch is kept turned on. Then, the booster circuit that generates the first voltage generates the first voltage by boosting an input voltage and using the ground voltage as a reference voltage (operation S14). Even if the first voltage temporarily increases to a positive level and the first parasitic transistor is turned off, the second parasitic transistor is kept turned off since the second switch is kept turned on. Accordingly, it is possible to prevent latch-up from occurring.

After the first voltage is stabilized, the second switch is turned off to generate the third voltage (operation S15). While both the first and second switches are turned off, the booster circuit that generates the third voltage generates the third voltage by boosting the first voltage and using the second voltage as a reference voltage (operation S16). Even if the second parasitic transistor is turned on before the third voltage is stabilized, the first parasitic transistor is kept turned off since the first voltage is stabilized at a low level, thereby preventing latch-up from occurring.

While the inventive concept has been particularly shown and described with reference to exemplary embodiments thereof, it will be understood that various changes in form and details may be made therein without departing from the spirit and scope of the following claims.

What is claimed is:

1. An internal supply voltage generator for generating at least one internal supply voltage, the internal supply voltage generator comprising:
   a first voltage booster circuit generating a first voltage from a first reference voltage and an input voltage, and outputting the first voltage via a first output terminal;
   a second voltage booster circuit generating a third voltage from a second voltage and the first voltage, and outputting the third voltage via a second output terminal; and
   at least one switch being coupled to at least one of the first output terminal and the second output terminal, and configured to operatively adjust at least one of the first voltage and the third voltage, wherein the at least one switch comprises:
   a first switch electrically connected between the first output terminal and the first reference voltage, and controlled in response to a first control signal; and
   a second switch electrically connected between the second output terminal and the second voltage, and controlled in response to a second control signal.

2. The internal supply voltage generator of claim 1, wherein switching of the first and second switches is controlled when the first and second voltage booster circuits are activated.

3. The internal supply voltage generator of claim 2, wherein the first and second voltage booster circuits are sequentially activated,
when the first voltage booster circuit is activated, the first switch is turned off and the second switch is turned on, and
when the second voltage booster circuit is activated, the first and second switches are turned off.

4. The internal supply voltage generator of claim 1, further comprising a third voltage booster circuit receiving an external voltage, and generating the input voltage and the second voltage from the external voltage.

5. The internal supply voltage generator of claim 4, wherein the first voltage booster circuit boosts the input voltage by using the first reference voltage, and
the second voltage booster circuit boosts the first voltage by using the second voltage.

6. The internal supply voltage generator of claim 5, wherein both the first and second switches are turned on in a first period in which the third voltage booster circuit is activated,
the first switch is turned off and the second switch is turned on in a second period in which the first voltage booster circuit is activated, and
both the first and second switches are turned off in a third period in which the second voltage booster circuit is activated.

7. The internal supply voltage generator of claim 6, wherein the first period comprises a period between when the third voltage booster circuit is activated and when the input voltage and the second voltage are stabilized,
the second period comprises a period between when the first voltage booster circuit is activated and when the first voltage is stabilized, and
the third period comprises a period between when the second voltage booster circuit is activated and when the third voltage is stabilized.

8. An internal supply voltage generator for generating at least one internal supply voltage, the internal supply voltage generator comprising:
a first voltage booster circuit generating a first voltage from a first reference voltage and an input voltage, and outputting the first voltage via a first output terminal;
a second voltage booster circuit generating a third voltage from a second voltage and the first voltage, and outputting the third voltage via a second output terminal; and
at least one switch being coupled to at least one of the first output terminal and the second output terminal, and configured to operatively adjust at least one of the first voltage and the third voltage, wherein the first voltage is a relatively low internal voltage generated in the internal supply voltage generator,
the second voltage is an intermediate internal voltage generated in the internal supply voltage generator, and
the third voltage is a relatively high internal voltage generated in the internal supply voltage generator.

9. The internal supply voltage generator of claim 8, wherein the first reference voltage is equal to a ground voltage.

10. A semiconductor device comprising:
an internal supply voltage generator comprising:
a first voltage booster circuit generating a first voltage from a first reference voltage and an input voltage, and outputting the first voltage via a first output terminal; and
a second voltage booster circuit generating a third voltage from a second voltage and the first voltage, and outputting the third voltage via a second output terminal;
a circuit block operating in response to at least one of the first to third voltages applied from the internal supply voltage generator; and
at least one switch being disposed to correspond to at least one of the first output terminal and the second output terminal, and adjusting at least one of the first voltage and the third voltage,
wherein the circuit block comprises a first parasitic transistor and a second parasitic transistor which are respectively connected to at least one of the first through third voltages, where a base and a collector of the first parasitic transistor are respectively connected to a collector and a base of the second parasitic transistor, and
the at least one switch comprises:
a first switch connected between the base and an emitter of the first parasitic transistor; and
a second switch connected between the base and an emitter of the second parasitic transistor.

11. The semiconductor device of claim 10, wherein turning on of the first parasitic transistor is prevented by switching off/on of the first switch, and
turning on of the second parasitic transistor is prevented by switching off/on of the second switch.

12. A semiconductor device comprising:
an internal supply voltage generator comprising:
a first voltage booster circuit generating a first voltage from a first reference voltage and an input voltage, and outputting the first voltage via a first output terminal; and
a second voltage booster circuit generating a third voltage from a second voltage and the first voltage, and outputting the third voltage via a second output terminal;
a circuit block operating in response to at least one of the first to third voltages applied from the internal supply voltage generator; and
at least one switch being disposed to correspond to at least one of the first output terminal and the second output terminal, and adjusting at least one of the first voltage and the third voltage, wherein the at least one switch comprises:
a first switch electrically connected between the first output terminal and the first reference voltage, and controlled in response to a first control signal; and
a second switch electrically connected between the second output terminal and the second voltage, and controlled in response to a second control signal.

13. The semiconductor device of claim 12, wherein the first and second voltage booster circuits are sequentially activated,
when the first voltage booster circuit is activated, the first switch is turned off and the second switch is turned on, and
when the second voltage booster circuit is activated, the first and second switches are turned off.

14. The semiconductor device of claim 12, further comprising a third voltage booster circuit receiving an external voltage and generating the input voltage and the second voltage from the external voltage.

15. The semiconductor device of claim 14, wherein both the first and second switches are turned on in a first period in which the third voltage booster circuit is activated,
the first switch is turned off and the second switch is turned on in a second period in which the first voltage booster circuit is activated, and
both the first and second switches are turned off in a third period in which the second voltage booster circuit is activated.

16. A method of driving an internal supply voltage generator generating at least one of first to third voltages, wherein the first voltage is a relatively low voltage, the second voltage is an intermediate voltage, and the third voltage is a relatively high voltage, and a first switch is connected to a first output terminal via which the first voltage is output and a second switch is connected to a second output terminal via which the third voltage is output, the method comprising:
generating at least one input voltage that is used to generate the first and third voltages while the first and second switches are turned on;
turning off the first switch, and activating the first voltage by using the at least one input voltage; and
turning off the second switch, and activating the third voltage by using the at least one input voltage.

17. The method of claim 16, wherein the at least one input voltage comprises the second voltage which is the intermediate voltage,
the first voltage is generated from the at least one input voltage and a reference voltage, and the first switch is electrically connected between the first output terminal and the reference voltage, and
the third voltage is generated from the first voltage and the second voltage, and the second switch is electrically connected between the second output terminal and the second voltage.

18. The method of claim 17, wherein the first switch is turned off in a period between when the at least one input voltage is stabilized and when the first voltage is activated, and
the second switch is turned off in a period between when the first voltage is stabilized and when the third voltage is activated.

19. An internal supply voltage generator comprising:
a first voltage booster circuit configured to generate a first voltage responsive to a first reference voltage and an input voltage;
a second voltage booster circuit configured to generate a third voltage responsive to a second voltage and the first voltage; and
a first switch operatively coupled between the first reference voltage and the first voltage; and
a second switch operatively coupled between the third voltage and the second voltage, wherein the first switch is turned off and the second switch is turned on responsive to the first voltage booster circuit being activated and wherein the first and second switches are turned off when the second voltage booster circuit is activated.

* * * * *